US012767578B2

(12) United States Patent
Doi et al.

(10) Patent No.: US 12,767,578 B2
(45) Date of Patent: Oct. 20, 2026

(54) SEMICONDUCTOR HEAT TREATMENT MEMBER

(71) Applicant: CoorsTek GK, Tokyo (JP)

(72) Inventors: Kanta Doi, Yamagata (JP); Kenta Ogama, Nishiokitamagun (JP)

(73) Assignee: CoorsTek GK, Tokyo (JP)

( * ) Notice: Subject to any disclaimer, the term of this patent is extended or adjusted under 35 U.S.C. 154(b) by 249 days.

(21) Appl. No.: 18/757,185

(22) Filed: Jun. 27, 2024

(65) Prior Publication Data

US 2025/0002390 A1 Jan. 2, 2025

(30) Foreign Application Priority Data

Jun. 30, 2023 (JP) ................................ 2023-108753
Jun. 7, 2024 (JP) ................................ 2024-093315

(51) Int. Cl.

| | |
|---|---|
| ***B32B 15/04*** | (2006.01) |
| ***B32B 17/06*** | (2006.01) |
| ***C03B 23/20*** | (2006.01) |
| ***C03C 3/06*** | (2006.01) |
| *H10P 72/00* | (2026.01) |

(52) U.S. Cl.

CPC ................ *C03B 23/20* (2013.01); *C03C 3/06* (2013.01); *C03C 2201/32* (2013.01); *H10P 72/0431* (2026.01)

(58) Field of Classification Search

CPC ...................................................... C03B 23/20
USPC ........................................................ 428/428
See application file for complete search history.

(56) References Cited

U.S. PATENT DOCUMENTS

| | | | | | |
|---|---|---|---|---|---|
| 3,882,901 | A * | 5/1975 | Seiler | C30B 31/10 428/428 |
| 3,925,583 | A * | 12/1975 | Rau | C03C 17/02 428/428 |
| 6,412,306 | B1 * | 7/2002 | Flieger | C03B 23/203 65/36 |
| 6,576,863 | B1 * | 6/2003 | Piltch | C03B 23/207 219/121.64 |
| 7,937,968 | B2 * | 5/2011 | Maul | C03C 27/06 65/36 |

(Continued)

FOREIGN PATENT DOCUMENTS

| | | | |
|---|---|---|---|
| CN | 104310763 | A | 1/2015 |
| JP | UM-S55-066922 | A | 5/1980 |

(Continued)

OTHER PUBLICATIONS

European Patent Office, Extended European Search Report, Application No. 24184989.2, dated Dec. 3, 2024, in 6 pages.

(Continued)

*Primary Examiner* — Lauren R Colgan
(74) *Attorney, Agent, or Firm* — PROCOPIO, CORY, HARGREAVES & SAVITCH LLP

(57) ABSTRACT

A semiconductor heat treatment member includes a plurality of quartz glass members fused to one another, a plurality of devitrified portions are formed in a fused portion at which the quartz glass members are fused, a maximum cross-sectional area of one devitrified portion among the plurality of devitrified portions is 1.76 $mm^2$ or less, and an area occupancy ratio of a total area of the plurality of devitrified portions to an area of a cross section of the fused portion is 10% or less.

4 Claims, 3 Drawing Sheets

(56) References Cited

U.S. PATENT DOCUMENTS

| | | | | |
|---|---|---|---|---|
| 2013/0174777 | A1* | 7/2013 | Kimura | C30B 15/10 65/17.3 |
| 2018/0201534 | A1* | 7/2018 | Donelon | C03B 23/20 |
| 2019/0109033 | A1* | 4/2019 | Elliot | B23K 1/0008 |
| 2022/0324740 | A1* | 10/2022 | Segawa | B32B 17/06 |
| 2022/0348490 | A1* | 11/2022 | Yamaguchi | B23K 26/38 |

FOREIGN PATENT DOCUMENTS

| | | | |
|---|---|---|---|
| JP | H03-177325 | A | 8/1991 |
| JP | H08-151220 | A | 6/1996 |
| JP | H08-165134 | A | 6/1996 |
| JP | H10-178005 | A | 6/1998 |
| JP | H11-060257 | A | 3/1999 |
| JP | 2007-170958 | A | 7/2007 |

OTHER PUBLICATIONS

Office Action in Korean Patent Application 10-2024-0085353 issued on Apr. 7, 2025 w/ English translation, 6 pages.
Japanese Patent Office, Office Action, Application No. 2024-093315, on Jul. 2, 2026, in 6 Pages.

* cited by examiner

SEMICONDUCTOR HEAT TREATMENT MEMBER

TECHNICAL FIELD

The present invention relates to a semiconductor heat treatment member, and particularly, to a semiconductor heat treatment member formed by fusing a plurality of quartz glass members.

BACKGROUND ART

In the case of manufacturing, from quartz glass, a box-shaped chamber (semiconductor heat treatment member) for treating a semiconductor wafer or the like, integral forming is not easy.

Therefore, a method of connecting end portions of a plurality of quartz glass plates by heat welding has been proposed.

For example, JPH10-178005A discloses a method of manufacturing a heat treatment container for treating a semiconductor wafer or the like, in which end portions of a plurality of quartz glass plates to be connected, which constitute a wall or the like, are connected to one another by heat welding using an oxygen-hydrogen burner or the like, and are assembled into a box shape.

However, in the case where the quartz glass plates are connected to one another by welding, there is a concern that bubbles may be mixed into a welded portion and the strength may be reduced, and there is a problem that the welded portion is easily cracked.

As a method of connecting quartz glass plates to one another to solve the problem such as welding, there is a method of fusion (deposition). For example, when end portions of two quartz glass plates are connected, the end portions are connected to each other by heating at a high temperature before melting.

According to such a connection method by fusion, it is possible to connect the quartz glass members to one another without bubbles being mixed into a welded portion such as welding and the strength being reduced.

SUMMARY OF INVENTION

In a case where the quartz glass members are fused, white spots called devitrification are likely to occur in a main body and at a fusion interface.

The term "devitrification" means that crystallization proceeds from a metastable glass state and changes to an aggregate of crystal grains grown from a number of crystal nuclei.

Accordingly, light is scattered at a grain boundary of crystals and becomes non-transparent in a devitrified portion. In addition, since the devitrification may become a starting point of product breakage due to a decrease in strength, it is said that removal of the devitrification is generally preferable.

However, it is difficult to perform fusion bonding completely without devitrification, and it is realistic to reduce devitrification as much as possible by low-temperature fusion.

That is, the quartz glass member can be used as a semiconductor heat treatment member as long as the member can be formed so as to reduce the devitrification generated in a fused portion and to prevent an extreme decrease in strength even when the member includes devitrification.

Therefore, the present inventors have intensively studied a devitrification range in which the strength does not significantly decrease even when devitrification occurs. Further, the present inventors have found that when occurrence of devitrification falls within a predetermined range, a significant decrease in strength is suppressed, and a quartz glass member can be suitably used as a semiconductor heat treatment member, and have completed the present invention.

The present invention has been made in view of the above circumstances, and an object thereof is to provide a semiconductor heat treatment member including a fused portion at which quartz glass members are fused, the semiconductor heat treatment member being capable of being suitably used for semiconductor heat treatment while suppressing a significant decrease in strength due to devitrification.

A semiconductor heat treatment member according to an aspect of the invention includes a plurality of quartz glass members fused to one another, wherein a plurality of devitrified portions are formed in a fused portion at which the quartz glass members are fused, a maximum cross-sectional area of one devitrified portion among the plurality of devitrified portions is 1.76 $mm^2$ or less, and an area occupancy ratio of a total area of the plurality of devitrified portions to an area of a cross section of the fused portion is 10% or less.

In this regard, it is preferable that a volume occupancy ratio per unit volume of the devitrified portion in a main body of the semiconductor heat treatment member other than the fused portion is 0.015% or less.

Further, it is preferable that each of the plurality of quartz glass members has an Al content of 5 ppm by weight or more and 25 ppm by weight or less.

As mentioned above, the semiconductor heat treatment member according the an aspect of the invention includes a plurality of quartz glass members fused to one another, wherein a plurality of devitrified portions are formed in a fused portion at which the quartz glass members are fused, a maximum cross-sectional area of one devitrified portion among the plurality of devitrified portions is 1.76 $mm^2$ or less, and an area occupancy ratio of a total area of the plurality of devitrified portions to an area of a cross section of the fused portion is 10% or less. The semiconductor heat treatment member having this configuration according to the invention can be suitably used for the semiconductor heat treatment while suppressing a significant decrease in strength.

According to the present invention, even when a fused portion of a fused semiconductor heat treatment member includes devitrification (devitrified portion), the semiconductor heat treatment member can be suitably used for the semiconductor treatment while suppressing a significant decrease in strength due to devitrification as long as the devitrification is within a predetermined range.

DETAILED DESCRIPTION OF THE INVENTION

Hereinafter, an embodiment of a semiconductor heat treatment member according to the present invention will be described with reference to FIGS. 1, 2A, and 2B.

Figure 1:
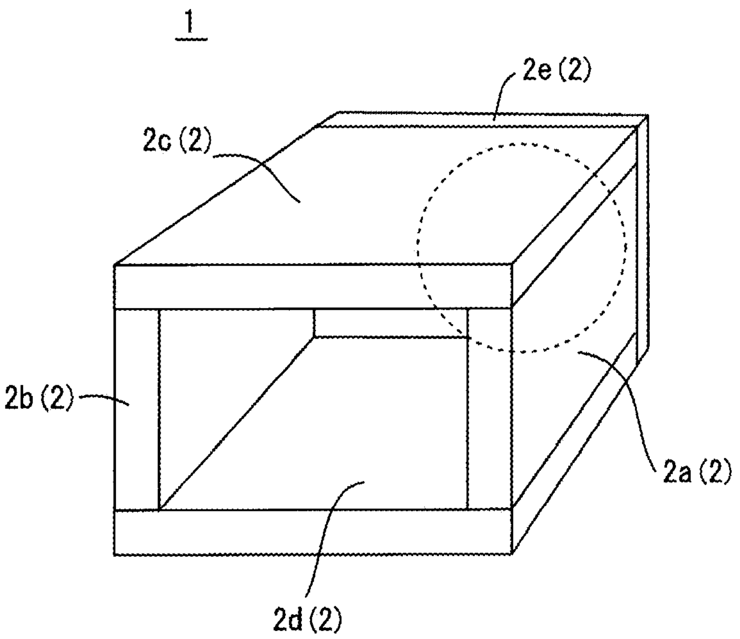
FIG. 1 is a perspective view of a semiconductor heat treatment member according to the present invention.
Figure 2A:
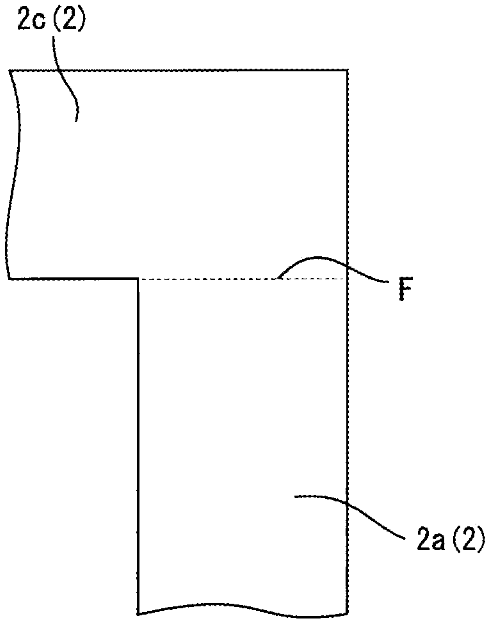
FIG. 2A is an enlarged front view of a part of the semiconductor heat treatment member in FIG. 1.
Figure 2B:
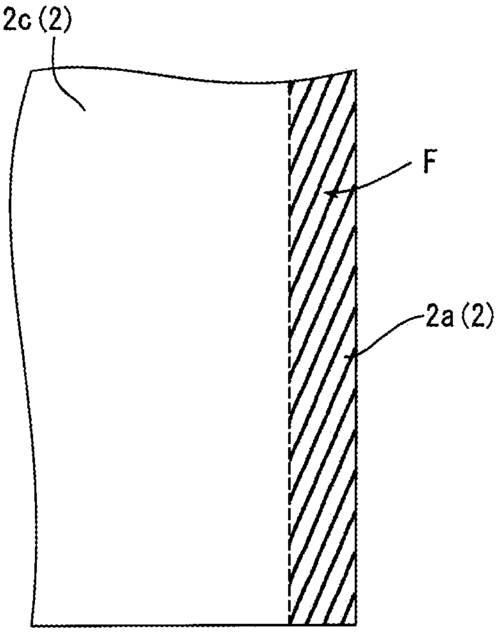
FIG. 2B is a plan view of FIG. 2A.

FIG. 1 is a perspective view illustrating a part of a chamber as the semiconductor heat treatment member according to the present invention, FIG. 2A is an enlarged front view illustrating a part (portion surrounded by broken line in FIG. 1) of the semiconductor heat treatment member in FIG. 1, and FIG. 2B is a plan view of FIG. 2A and an enlarged plan view illustrating a part of the semiconductor heat treatment member in FIG. 1.

The drawings are schematic or conceptual, and the relationship between the thickness and the width of each portion, the size ratio between portions, etc. are not accurately illustrated.

As illustrated in FIG. 1, a chamber 1 (semiconductor heat treatment member) is implemented by assembling a plurality of (five in the drawing) rectangular quartz glass plates 2 (quartz glass members) having a predetermined thickness.

In the illustrated example, two side plates 2*a* and 2*b*, one top plate 2*c*, one bottom plate 2*d*, and one back plate 2*e*, which are made of quartz glass, are connected. That is, in this example, the chamber 1 is formed in a box shape opened forward.

The quartz glass plates 2 are fusion-bonded at end portions (end surfaces or edges) thereof.

Specifically, the quartz glass plates 2 are heated and fused while applying a predetermined pressure at the end portions of the quartz glass plates 2. Accordingly, devitrification occurs at a fused portion F illustrated in FIGS. 2A and 2B and a main body main body other than the fused portion F.

Here, the fused portion F refers to an interface between two quartz glass plates 2 that are fusion-bonded. In addition, the main body other than the fused portion F means the inside of the quartz glass plate 2 except for an outer surface, which is a portion other than the fused portion F (interface) in the quartz glass plate 2.

Figure 5:
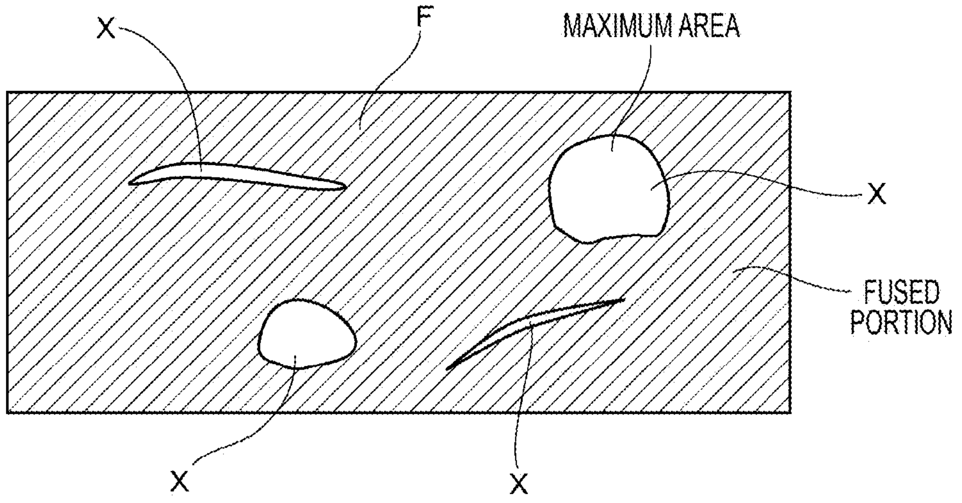
FIG. 5 is a conceptual diagram illustrating a plurality of devitrified portions formed in a fused portion.

As illustrated in FIG. 5, devitrification occurs in the fused portion F. The devitrification occurred in the fused portion F has a linear or planar shape, and a plurality of linear or planar devitrifications are present in the fused portion F.

Here, the devitrifications are referred to as devitrified portions X, and the devitrified portions X are illustrated in FIG. 5. FIG. 5 is a diagram for facilitating understanding, is a schematic or conceptual diagram, and does not accurately illustrate a size of the devitrified portion X.

In the fused portion F, the devitrified portion X is planar or linear, but a maximum cross-sectional area of one devitrified portion X is 1.76 $mm^2$ or less, and a total area of all the devitrified portions X (total area occupancy ratio) is 10% or less with respect to a cross-sectional area of the fused portion F.

When the maximum cross-sectional area of one devitrified portion X in the fused portion F exceeds 1.76 $mm^2$, the strength decreases, which is not preferable.

In addition, when the total area of all the devitrified portions X (total area occupancy ratio) exceeds 10% with respect to the cross-sectional area of the fused portion F, the strength decreases, which is not preferable.

Here, the maximum cross-sectional area of the devitrified portion X refers to a cross section obtained by cutting the devitrified portion at any angle, and satisfies the above range in a cross section at any angle. In addition, the cross-sectional area of the fused portion F refers to a cross section of the fused portion F cut along a fusion interface.

Figure 6:
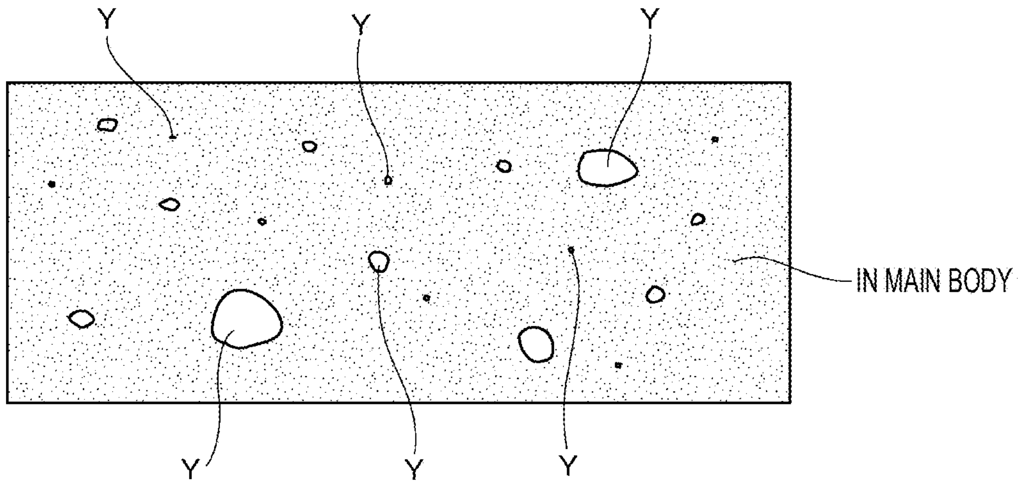
FIG. 6 is a conceptual diagram illustrating a plurality of devitrified portions formed in a main body other than the fused portion.

As illustrated in FIG. 6, a plurality of spherical devitrifications occur in the main body other than the fused portion F. The devitrifications occur at the time of forming the fused portion F.

Here, the devitrifications are referred to as devitrified portions Y. FIG. 6 illustrates the devitrified portions Y. FIG. 6 is a diagram for facilitating understanding, is a schematic or conceptual diagram, and does not accurately illustrate the size of the devitrified portion Y.

In the semiconductor heat treatment member according to the embodiment of the present invention, five or less spherical devitrified portions Y having an average diameter of 2 mm or more, ten or less devitrified portions Y having an average diameter of 1 mm or more and less than 2 mm, and 15,000 or less devitrified portions Y having an average diameter of less than 1 mm are formed in the main body other than the fused portion F.

The devitrified portions Y existing in the main body other than the fused portion F have the above distribution, so that it is possible to suppress a decrease in strength.

In the main body other than the fused portion F, the devitrified portion Y is spherical, and a volume occupancy ratio of a total volume of the devitrified portions Y per unit volume is preferably 0.015% or less.

When the volume occupancy ratio of the total volume of the devitrified portions Y in the main body other than the fused portion F is 0.015% or less, a decrease in strength can be suppressed. Furthermore, deformation due to heat can be suppressed.

The semiconductor heat treatment member preferably has an Al content of 5 ppm by weight or more and 25 ppm by weight or less. When the Al content falls within the above range, a decrease in strength can be suppressed.

More preferably, a Ca content is 2.0 ppm by weight or less, an Mg content is 0.3 ppm by weight or less, and a Na content is 0.5 ppm by weight or less. When the Ca content and the like are within the above ranges, a decrease in strength can be suppressed.

Next, a method of manufacturing the chamber 1 as a semiconductor heat treatment member will be described.

First, five quartz glass plates 2 (side plates 2*a* and 2*b*, top plate 2*c*, bottom plate 2*d*, and back plate 2*e*) constituting the chamber 1 which is a semiconductor heat treatment member are prepared.

The quartz glass plates 2 have an Al content of 5 ppm by weight or more and 25 ppm by weight or less, a Ca content of 2.0 ppm by weight or less, an Mg content of 0.3 ppm by weight or less, and a Na content of 0.5 ppm by weight or less. As long as the Al content is within the above range, a commercially available quartz glass plate may be used.

Next, the quartz glass plates 2 are heated at a temperature of 1,000° C. or higher and 1,700° C. or lower, and end portions thereof are fused by being pressed in opposite directions at 0.1 $kg/cm^2$ or more and 10 $kg/cm^2$ or less.

That is, in the case of the chamber 1 illustrated in FIG. 1, for example, left and right edge portions of the bottom plate 2*d* are welded to lower end surfaces of the side plates 2*a* and 2*b*, respectively, and upper end surfaces of the side plates 2*a* and 2*b* are welded to left and right edge portions of the top plate 2*c*, respectively. Then, rear end surfaces of the side plates 2*a* and 2*b*, the bottom plate 2*d*, and the top plate 2*c* are welded to four edge portions of the back plate 2*e*.

In this manner, end portions of all the quartz glass plates 2 are connected, followed by cooling, thereby obtaining the chamber 1 (semiconductor heat treatment member) having the shape illustrated in FIG. 1.

As described above, according to the present invention, when the quartz glass plates 2 are connected, the quartz glass plates 2 are heated at a temperature of 1,000° C. or higher and 1,700° C. or lower and are pressed to be fused. When the temperature is lower than 1,000° C., the plates are not sufficiently fused and the strength decreases due to the low temperature. When the temperature exceeds 1,700° C., the shape of the quartz glass plates 2 cannot be maintained due to the high temperature.

Regarding pressing during fusion, it is desirable that the end portions are pressed in opposite directions at 0.1 $kg/cm^2$ or more and 10 $kg/cm^2$ or less.

The quartz glass plate 2 can be fused without deformation by being pressed at 0.1 $kg/cm^2$ or more and 10 $kg/cm^2$ or less. In addition, the end portions of the quartz glass plates 2 can be uniformly fused.

In the fused portion F where the quartz glass plates 2 are fused, the devitrified portion X is planar or linear, but a maximum cross-sectional area of one devitrified portion X is 1.76 $mm^2$ or less, and a total area of all the devitrified portions X (area occupancy ratio) is 10% or less with respect to a cross-sectional area of the fused portion F.

The maximum cross-sectional area of one devitrified portion X and the total area (area occupancy ratio) of the devitrified portions X are controlled by a degree of pressurization, a degree of heating temperature of the quartz glass plate 2, or a degree of Al content of the quartz glass member.

In the above embodiment, the chamber 1 in which a plurality of quartz glass plates are fused as the semiconductor heat treatment member according to the present invention is illustrated, but the present invention is not limited to this embodiment, and can be widely applied to a semiconductor heat treatment member formed by fusing quartz glass members.

EXAMPLES

A semiconductor heat treatment member and a manufacturing method thereof according to the present invention will be further described based on examples.

Experiment

In an experiment, a maximum cross-sectional area ($mm^2$) of one devitrified portion among devitrified portions, a total area (area occupancy ratio %) of all the devitrified portions with respect to a cross-sectional area of the fused portion F, and a volume occupancy ratio % of the devitrified portion other than the fused portion F were verified in order to ensure a breaking strength required for the semiconductor heat treatment member and sufficiently suppress thermal deformation in the fused portion.

Example 1

In Example 1, two quartz glass plates (Al: 10 ppm by weight, Ca: 1.0 ppm by weight, Mg: 0.1 ppm by weight, and Na: 0.1 ppm by weight) were prepared. The quartz glass plate had a length of 100 mm, a width of 100 mm, and a thickness of 30 mm, and two quartz glass plates having the same dimensions were prepared. No devitrification was observed in the two quartz glass plates. The content of each element in the quartz glass plate was measured using ICP emission spectrometry.

Then, end portions of the two quartz glass plates were heated, and were pressed at 5 $kg/cm^2$ for 1 hour when the temperature reached 1,700° C., to fuse the end portions, thereby preparing a sample.

Figure 3:
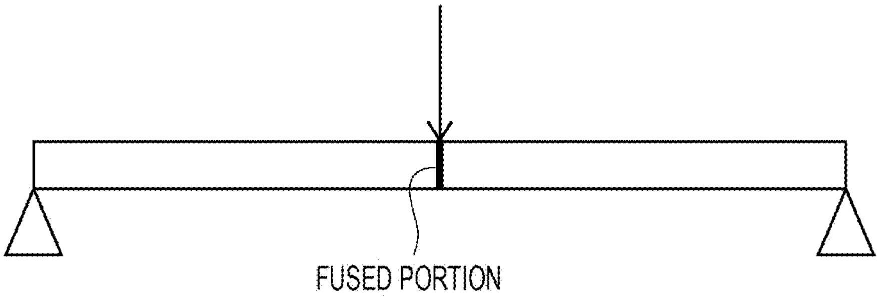
FIG. 3 is a conceptual diagram illustrating a method of measuring a breaking strength by a three-point bending test.

As illustrated in FIG. 3, a load was applied to a fused portion of the obtained sample, and the breaking strength was measured and evaluated by a three-point bending test (JIS1601:2008). As a result, the breaking strength is 135 MPa or more, which is good as strength, and is described as A in Table 1.

In Table 1, since the breaking strength of the quartz glass member itself is 135 MPa, the breaking strength of 135 MPa or more is higher than the breaking strength of the quartz glass member itself, and thus is denoted by A. In addition, the breaking strength of less than 135 MPa is smaller than the breaking strength of the quartz glass itself, and thus is denoted by C.

Figure 4:
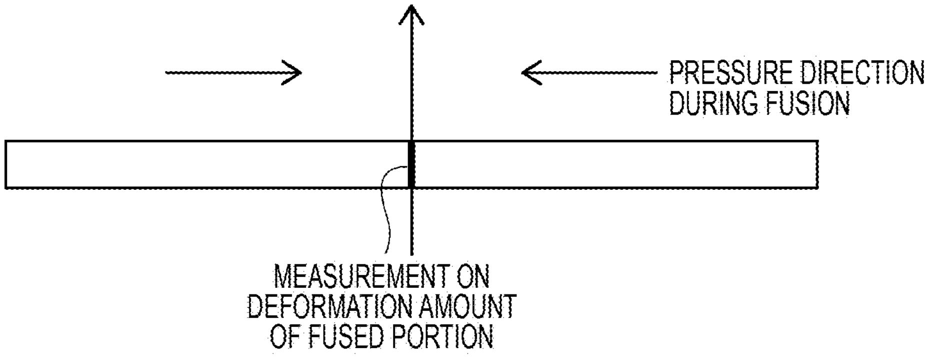
FIG. 4 is a conceptual diagram illustrating a method of evaluating thermal deformation by calculating a deformation amount from lengths before and after fusion of a quartz glass plate.

As illustrated in FIG. 4, the length before fusion and the length after fusion (measured by a caliper) in a direction perpendicular to a pressing direction at the time of fusion of the quartz glass plates were compared, and a deformation amount was calculated to evaluate the thermal deformation. As a result, the deformation amount is 2.5 mm, which is small and good, and is described as A in Table 1.

In Table 1, a case where the deformation amount is 0 mm to 3.0 mm is denoted by A, and a case where the deformation amount exceeds 3.0 mm is denoted by B.

As illustrated by FIG. 5, in the fused portion, an area of one devitrified portion X having the maximum area among the devitrified portions X was measured by a microscope. In addition, an area occupancy ratio (%) of a total area of the devitrified portions to an area of the fused portion was measured.

As a result, the area of one devitrified portion X having the maximum area among the devitrified portions X is 1.62 $mm^2$. The area occupancy ratio (%) of the total area of the devitrified portions to the area of the fused portion is 9%.

As illustrated in FIG. 6, the volume occupancy ratio (%) of the total volume of the devitrified portions Y per unit volume in the main body was measured by a microscope and visual observation. As a result, the volume occupancy ratio (%) of the devitrified portion Y is 0.015%.

Example 2

In Example 2, a quartz glass plate (Al: 18 ppm by weight, Ca: 1.0 ppm by weight, Mg: 0.1 ppm by weight, Na: 0.1 ppm by weight) was used. No devitrification was observed in two quartz glass plates. The content of each element in the quartz glass plate was measured using ICP emission spectrometry.

Then, end portions of the two quartz glass plates were heated, and were pressed at 5 $kg/cm^2$ for 1 hour when the temperature reached 1,300° C., to fuse the end portions, thereby preparing a sample.

A fused portion of the obtained sample was subjected to the same measurement and evaluation as in Example 1. The results are shown in Table 1.

Example 3

In Example 3, a quartz glass plate (Al: 5 ppm by weight, Ca: 1.0 ppm by weight, Mg: 0.1 ppm by weight, Na: 0.1 ppm by weight) was used. No devitrification was observed in two quartz glass plates. The content of each element in the quartz glass plate was measured using ICP emission spectrometry.

Then, end portions of the two quartz glass plates were heated, and were pressed at 10 $kg/cm^2$ for 1 hour when the temperature reached 1,300° C., to fuse the end portions, thereby preparing a sample.

A fused portion of the obtained sample was subjected to the same measurement and evaluation as in Example 1. The results are shown in Table 1.

Example 4

In Example 4, a quartz glass plate (Al: 25 ppm by weight, Ca: 1.0 ppm by weight, Mg: 0.1 ppm by weight, Na: 0.1 ppm by weight) was used. No devitrification was observed in two quartz glass plates. The content of each element in the quartz glass plate was measured using ICP emission spectrometry.

Then, end portions of the two quartz glass plates were heated, and were pressed at 10 $kg/cm^2$ for 1 hour when the temperature reached 1,700° C., to fuse the end portions, thereby preparing a sample.

A fused portion of the obtained sample was subjected to the same measurement and evaluation as in Example 1. The results are shown in Table 1.

Comparative Example 1

In Comparative Example 1, a quartz glass plate (Al: 26 ppm by weight, Ca: 1.0 ppm by weight, Mg: 0.1 ppm by weight, Na: 0.1 ppm by weight) was used. No devitrification was observed in two quartz glass plates. The content of each element in the quartz glass plate was measured using ICP emission spectrometry.

Then, end portions of the two quartz glass plates were heated at 1,700° C. for 1 hour, and were pressed at 0.01 $kg/cm^2$ for 1 hour to fuse the end portions, thereby preparing a sample.

A fused portion of the obtained sample was subjected to the same measurement and evaluation as in Example 1. The results are shown in Table 1.

Comparative Example 2

In Comparative Example 2, the quartz glass plate used in Example 1 was used, and end portions of two quartz glass plates were heated at 1,700° C. for 1 hour and were pressed at 0.01 $kg/cm^2$ for 1 hour to fuse the end portions, thereby preparing a sample.

A fused portion of the obtained sample was subjected to the same measurement and evaluation as in Example 1. The results are shown in Table 1.

Comparative Example 3

In Comparative Example 3, the quartz glass plate used in Example 1 was used, and end portions of two quartz glass plates were heated at 1,800° C. and were pressed at 5 $kg/cm^2$ for 1 hour, but a shape of the quartz glass plate cannot be maintained, and a sample cannot be manufactured.

Comparative Example 4

In Comparative Example 4, the quartz glass plate used in Example 1 was used, and end portions of two quartz glass plates were heated at 900° C. and pressed at 5 $kg/cm^2$ for 1 hour, but the quartz glass plates were not fused.

Except for Comparative Examples 3 and 4, results of Examples 1 to 4 and Comparative Examples 1 and 2 are shown in Table 1.

As described above, in Evaluation 1 (breaking strength) in Table 1, A indicates a breaking strength of 135 MPa or more, and C indicates a breaking strength of less than 135 MPa. In Evaluation 2 (thermal deformation), A indicates a deformation amount of 0 mm to 3.0 mm, and B indicates a deformation amount exceeding 3.0 mm.

TABLE 1

| | | | Fused portion | | Other than fused portion | | | | |
|---|---|---|---|---|---|---|---|---|---|
| | Fusion temperature | Fusion pressure | Maximum cross-sectional area ($mm^2$) of one devitrification | Area occupancy ratio (%) | Volume occupancy ratio (%) | Evaluation 1 Strength (MPa) | | Evaluation 2 Thermal deformation (mm) | |
| Comparative example 1 | 1,700 | 0.01 | 1.8 | 10 | 0.015 | 58 | C | 2.3 | A |
| Comparative example 2 | 1,700 | 0.01 | 1.76 | 11 | 0.015 | 20 | C | 2.3 | A |
| Example 1 | 1,700 | 5 | 1.62 | 9 | 0.015 | 135 | A | 2.5 | A |
| Example 2 | 1,300 | 5 | 0.0078 | 10 | 0.015 | 138 | A | 0.5 | A |
| Example 3 | 1,300 | 10 | 0.0078 | 0.001 | 0.015 | 139 | A | 0.9 | A |
| Example 4 | 1,700 | 10 | 1.76 | 10 | 0.018 | 137 | A | 3.6 | B |

As shown in Table 1, it is confirmed that in order to ensure the necessary breaking strength and sufficiently suppress the thermal deformation, the maximum cross-sectional area of one devitrification in the fused portion is 1.76 $mm^2$ or less, and the area occupancy ratio of the total area of the devitrified portions is 10% or less.

What is claimed is:

1. A semiconductor heat treatment member comprising a plurality of quartz glass members fused to one another, wherein a plurality of devitrified portions are formed in a fused portion at which the quartz glass members are fused, a maximum cross-sectional area of one devitrified portion among the plurality of devitrified portions is 1.76 $mm^2$ or less, and an area occupancy ratio of a total area of the plurality of devitrified portions to an area of a cross section of the fused portion is 10% or less.

2. The semiconductor heat treatment member according to claim 1, wherein a volume occupancy ratio per unit volume of the devitrified portion in a main body of the semiconductor heat treatment member other than the fused portion is 0.015% or less.

3. The semiconductor heat treatment member according to claim 1, wherein each of the plurality of quartz glass members has an Al content of 5 ppm by weight or more and 25 ppm by weight or less.

4. The semiconductor heat treatment member according to claim 2, wherein each of the plurality of quartz glass members has an Al content of 5 ppm by weight or more and 25 ppm by weight or less.

* * * * *